(12) United States Patent
Wilkins

(10) Patent No.: US 8,272,780 B1
(45) Date of Patent: Sep. 25, 2012

(54) MULTIPLE-UNIT THERMAL TEST APPARATUS FOR ELECTRICAL DEVICES

(75) Inventor: Thomas Wilkins, Morro Bay, CA (US)

(73) Assignee: Rantec Power Systems, Inc., Los Osos, CA (US)

( * ) Notice: Subject to any disclaimer, the term of this patent is extended or adjusted under 35 U.S.C. 154(b) by 616 days.

(21) Appl. No.: 12/545,446

(22) Filed: Aug. 21, 2009

(51) Int. Cl.
*G01R 31/02* (2006.01)
*G01R 31/28* (2006.01)

(52) U.S. Cl. .......... 374/152; 374/5; 374/57; 324/750.03

(58) Field of Classification Search .......... 374/1, 4, 374/5, 45, 57, 100, 141, 152, 163, 170, 183, 374/185; 324/105, 501, 750.03, 750.3, 762.01; 702/35, 117
See application file for complete search history.

(56) References Cited

U.S. PATENT DOCUMENTS

| | | | |
|---|---|---|---|
| 3,656,058 A * | 4/1972 | Leathers ................ | 324/750.03 |
| 4,978,914 A * | 12/1990 | Akimoto et al. ......... | 324/750.03 |
| 6,272,767 B1 * | 8/2001 | Botruff et al. ........... | 34/202 |
| 7,070,323 B2 * | 7/2006 | Wanek et al. ........... | 374/45 |
| 7,527,426 B2 * | 5/2009 | Liu et al. ............... | 374/29 |
| 7,656,180 B2 * | 2/2010 | Lee et al. ............... | 324/750.06 |
| 7,663,389 B2 * | 2/2010 | Teneketges ............. | 324/762.06 |
| 7,932,734 B2 * | 4/2011 | Merrow et al. .......... | 324/750.03 |
| 2005/0103034 A1 * | 5/2005 | Hamilton et al. ........ | 62/186 |
| 2011/0012631 A1 * | 1/2011 | Merrow et al. .......... | 324/750.03 |

FOREIGN PATENT DOCUMENTS

JP 61026874 A * 2/1986
JP 2006308368 A * 11/2006

* cited by examiner

*Primary Examiner* — R. A. Smith
(74) *Attorney, Agent, or Firm* — Hickman Palermo Truong Becker Bingham Wong LLP

(57) ABSTRACT

A system for testing electrical devices under varying thermal conditions is disclosed. The system includes a fixture that comprises two vertically arranged rails, into which horizontally arranged electrical devices are inserted. The rails are in contact with two thermal plates whose temperatures are controlled by controller or controllers. Target temperatures for the two thermal plates are communicated to the controller or controllers, and the electrical output of the electrical devices under test are monitored under varying thermal conditions.

20 Claims, 4 Drawing Sheets

MULTIPLE-UNIT THERMAL TEST APPARATUS FOR ELECTRICAL DEVICES

FIELD OF THE DISCLOSURE

The present disclosure relates generally to testing electrical devices in varying thermal conditions.

BACKGROUND

Electric devices are often subject to thermal conditions that vary over a wide range. As such, it is important for manufacturers of electric devices to test the electric devices in varying thermal conditions, including thermal conditions that are known or expected to exist in the places where the electric devices are to be deployed. For example, if an electrical device is to be deployed in an environment where the temperature may raise to 100 degrees Fahrenheit, then it would be important to test the electrical device's operation in an environment whose temperature reaches at least 100 degrees Fahrenheit, and to monitor the electrical device's performance in such an environment.

Often, electrical devices are subject to thermal stimuli that directly contact the electrical devices. For example, an electrical device may be mounted in a chassis, enclosure or other fixture such that the electrical device directly contacts the fixture, where the fixture's temperature is known to vary over a wide range. In cases like this, it would also be important to test how the electrical device performs as the fixture's temperature varies over a range.

Traditional techniques for testing electrical devices in varying thermal conditions include placing an assembly or circuit board carrying the electrical device under test on top of, under, or between thermal plates, where the thermal plates are horizontally oriented with respect to the electrical device under test and where the temperature of the thermal plates can be controlled. This approach, however, does not allow for the simultaneous testing of multiple assemblies or boards. In addition, this approach also does not accurately predict how the electrical device under test will perform when the electrical device under test is deployed in a configuration where only the edges of the assembly or board directly contact a fixture.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

The features and advantages of the various example embodiments contained in this disclosure will become apparent from the following detailed description when considered in conjunction with the accompanying drawings. Where possible, the same reference numerals and characters are used to denote like features, elements, components or portions of the various inventive embodiments. Optional components, features or embodiments are generally shown in dotted lines. It is intended that changes and modifications can be made to the described example embodiments without departing from the true scope and spirit of the various inventive embodiments as is generally defined by the Claims.

In the drawings.

DETAILED DESCRIPTION

Figure 1:
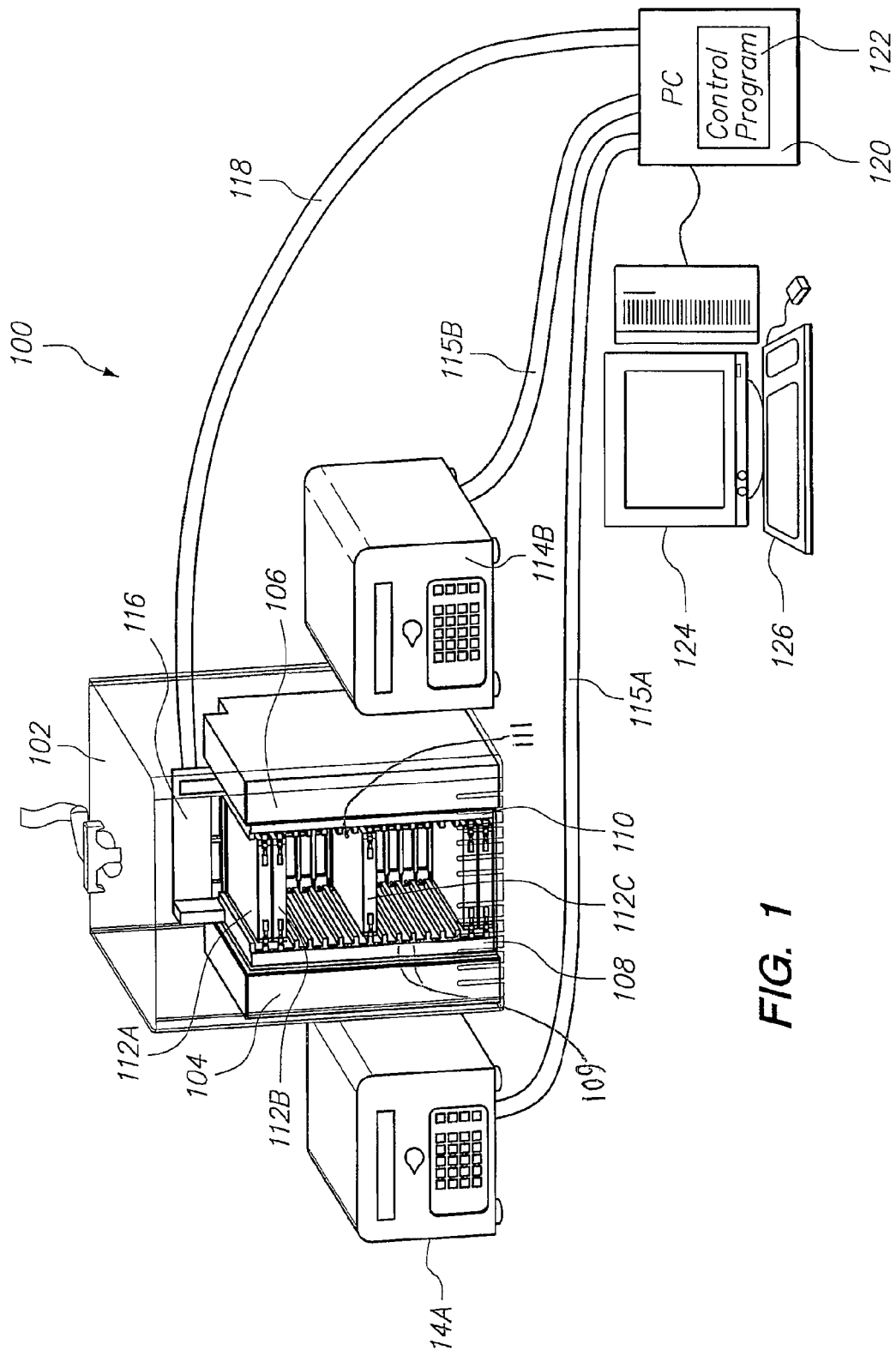
FIG. 1 is an isometric view of a testing system in accordance with an embodiment.

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Embodiments are described herein according to the following outline:
  1.0 General Overview
  2.0 Structural and Functional Description
  3.0 Example Testing System
    3.1 Example Testing System Structural Details
    3.2 Example Testing System Functional Details
  4.0 Extensions and Alternatives
  5.0 Hardware Overview
  1.0 General Overview In an embodiment, a system for testing electrical devices under varying thermal conditions is disclosed. The thermal conditions are varied through the use of thermal plates, which are plates whose temperatures may be varied and controlled. The thermal plates are arranged vertically with respect to the electrical devices under test, thereby allowing multiple electrical devices to be tested at the same time. In this context, the term "electrical devices" includes assemblies, circuit boards, modules and the like. In addition, because the thermal plates are arranged vertically with respect to the electrical devices under test, the electrical devices under test are subject to varying thermal conditions at the edges of the devices, including by direct contact at the edges, instead of over an entire upper or lower surface area, as is the case when a thermal plate is placed on top of or below an electrical device under test. Varying thermal conditions only at the edges of the electrical devices under test more accurately predicts how the electrical devices under test will perform when the electrical devices under test are deployed in a configuration where only the edges of the electrical devices directly contact a structure undergoing varying thermal conditions.

In an embodiment, the system for testing electrical devices under varying thermal conditions includes a fixture that is configured to receive one or more electrical devices. The fixture includes a pair of vertical rails that form slots for receiving the one or more electrical devices. Electrical devices received by the fixture are horizontally oriented and contact the pair of vertical rails. The system further includes a pair of thermal plates which contact the pair of vertical rails and are vertically arranged with respect to electrical devices received by the fixture. The temperature of each thermal plate in the pair of thermal plate may be controlled independently by controller or controllers. The system also includes a monitoring unit that is electrically coupled to the electrical devices received by the fixture for monitoring the electrical output of the electrical devices.

In an embodiment, the system further includes a control program that determines target temperatures for each thermal plate in the pair of thermal plates. These target temperatures are communicated to controller or controllers that controls the temperatures of the thermal plates. In response to receiving communications that includes target temperatures for the thermal plates, the controller adjusts the temperatures of the thermal plates to conform to the target temperatures.

In an embodiment, the control program determines the target temperatures based on user input.

In an embodiment, the control program determines the target temperatures based on characterization data that indicates relationships between the temperatures of the thermal plates and the temperatures of the rails of the fixtures.

In an embodiment, the characterization data indicates relationships between the temperatures of the thermal plates and the temperatures of the rails of the fixtures, that take into account a number or location of slots of the fixtures are occupied by the electrical devices.

In an embodiment, the monitoring unit stores data about the electrical output of the electrical devices in a computer-readable storage medium.

In an embodiment, the monitoring unit examines the electrical output of the electrical devices and determines whether there are any errors in the electrical output.

In other example embodiments, a process for testing electrical devices under varying thermal conditions is provided.

2.0 Structural and Functional Description

In various example embodiments, a system includes a fixture that is configured to receive one or more electrical devices for testing the electrical devices under varying thermal conditions.

The fixture includes a first rail and a second rail that are vertically oriented. Indentations in the rails form slots into which electrical devices may be inserted. An electrical device that is inserted into a slot in the fixture's rails is horizontally oriented and edges of the device contact the slots. The fixture may be configured to receive any number of electrical devices. Not all available slots in the fixture need to be filled with electrical devices in order for testing to take place. Thus, the fixture may be configured to receive one or more electrical devices for testing.

The system further includes a first thermal plate and a second thermal plate that are vertically oriented. The first thermal plate is mounted or placed in contact with the first rail of the fixture, and the second thermal plate is mounted or placed in contact with the second rail of the fixture. Consequently, the thermal plates are also perpendicular to the horizontally oriented electrical devices received by the fixture, and can conductively communicate heat to or from the rails, slots and devices.

The two thermal plates may be hot-cold plates whose temperatures can be varied and controlled. The thermal plates may be aluminum plates that contain heaters and liquid nitrogen cooling tubes for temperature control. In one embodiment, the thermal plates are hot-cold plates manufactured by and commercially available from Sigma Systems Corporation in San Diego, Calif.

The system includes controller or controllers that controls the temperatures of the two thermal plates. The temperatures of the two thermal plates may be controlled separately and independently. The controller or controllers adjusts the temperatures of the thermal plates to desired temperatures. In one embodiment, the system includes two controllers, one for controlling the temperature of the first thermal plate and another for controlling the temperature of the second thermal plate.

The system also includes a monitoring unit that monitors the electrical output of the electrical devices in the fixture. The monitoring unit may include a backplane that is electrically coupled to the electrical devices in the fixture so that components of the devices may be monitored in terms of electrical characteristics, performance, or other factors.

In one embodiment, the system further includes a control program that determines a first target temperature for the first thermal plate and a second target temperature for the second thermal plate. The control program may reside and execute on a computer system. The first and second target temperatures are communicated to the controller or controllers that controls and adjusts the temperatures of the thermal plates. When the control program is residing on a computer system, a communications link may be established between the computer system and the controller or controllers. For example, a cable may be used to connect the computer system to the controller or controllers. Communications that include the target temperatures may then be conveyed to the controller or controllers via the communications link.

When the controller or controllers receives communications that indicate a first target temperature and a second target temperature, the controller responds by adjusting the temperature of the first thermal plate to the first target temperature and the temperature of the second thermal plate to the second target temperature.

In one embodiment, the control program determines the first target temperature and the second target temperature based on user input. For example, when the control program is resident on a computer system, the computer system may include a display device and a user input device, through which users may input a temperature or a range of temperatures as the thermal conditions for testing the electrical devices. In one example, a user specifies that the electrical devices be tested from temperatures ranging from −55 degrees Celsius to +95 degrees Celsius.

The user may further specify how to increment the temperature and how long to sustain each temperature achieved. For example, the user may specify that the temperature be incremented in increments of five degrees Celsius and that each incremented temperature be sustained for ten minutes. This user input may be received by the control program, which then determines, at the appropriate time intervals, the target temperatures to communicate to the controllers.

In one embodiment, the control program determines the first target temperature and the second target temperature based on characterization data. Characterization data indicates a relationship or difference between the temperature of the first thermal plate and the resultant temperature of the first rail of the fixture and a relationship between the temperature of the second thermal plate and the resultant temperature of the second rail of the fixture.

When a thermal plate is adjusted to a particular temperature, the temperature of a rail that is in contact with the thermal plate does not necessarily also adjust to precisely the particular temperature. For example, when the temperature of a thermal plate is adjusted to 20 degrees Celsius, the temperature of the rail that is in contact with the thermal plate may actually be 22 degrees Celsius or 18 degrees Celsius. However, since the electrical devices being tested are in thermal contact with the rails, not the thermal plates, it is important to monitor the electrical outputs of the electrical devices under thermal conditions actually experienced by the electrical devices. In other words, it is desirable to collect test data that is aligned with the actual temperatures of the rails in contact with the electrical devices under test. Further, the on-board temperature of a device may not match the temperatures of thermal plates 104, 106 due to conductivity properties of the boards. Therefore, based on the characterization data, the control program determines target temperatures for the thermal plates that would result in particular temperatures for the rails of the fixture. This determination is based on characterization data that indicates how temperatures of the thermal plates affect the temperatures of the rails of the fixture.

In one embodiment, the determination of the target temperatures for the thermal plates is based on both user input and characterization data. For example, if a user has indicated that he wishes to test the electrical devices at 50 degrees Celsius, then the characterization data may be examined to determine what thermal plate temperatures would achieve 50 degrees Celsius temperatures at the rails. In this example, if the characterization data indicates that to achieve 50 degrees Celsius at both rails, the temperature of the first thermal plate should be 51 degrees Celsius and the temperature of the second thermal plate should be 52 degrees Celsius, then the control program will determines a target temperature of 51 degrees Celsius for the first thermal plate and a target temperature of 52 degrees Celsius for the second thermal plate and communicate these target temperatures to the controller or controllers.

The exact on-board temperature experienced by a particular electrical device in the fixture may depend on the position occupied by the electrical device in the fixture and the positions occupied by other electrical devices in the fixture. Thermal conductivity properties of the rails may affect temperatures at various slot positions. For example, an electrical device located in the topmost slot in the fixture may experience temperatures of 50 degrees Celsius when the temperatures of the two thermal plates are at 52 degrees Celsius, while the same electrical device, if located in the bottommost slot in the fixture, would experience temperatures of 51 degrees Celsius when the temperatures of the two thermal plates are at 52 degrees Celsius.

In another example, an electrical device located in a particular slot of the fixture may experience temperatures of 50 degrees Celsius when the temperature of the two thermal plates are at 52 degrees Celsius if there are no other electrical devices in the fixture, but may experience temperatures of only 48 degrees Celsius if the fixture contains five additional devices.

In one embodiment, the characterization data indicates what temperatures are experienced by electrical devices in the fixture as the temperatures of the thermal plates and the occupancy of the slots in the fixture varies. Alternatively, the characterization data may comprise scaling factors or difference values for different slot positions. A user may input to the control program which slots of the fixture are occupied by electrical devices and a desired temperature range for testing the electrical devices. Based on this information, the control program examines the characterization data and determines the target temperatures for the thermal plates to achieve the user-specified temperatures for the electrical devices.

The characterization data may be gathered through empirical observation or using sensors and feedback loops. The characterization data may also be stored on the computer system as a "lookup table" that is provided to the control program to "look up" what target temperatures are needed to achieve a particular rail temperature for a particular slot in the fixture and for a particular fixture occupancy.

In one embodiment, the monitoring unit monitors the electrical output of the electrical devices in the fixture and stores the electrical output in a computer-readable storage medium. For example, the monitoring unit may include a backplane that is electrically coupled to the electrical devices in the fixture such that the electrical outputs of the electrical devices are communicated to the backplane, and the backplane may communicate the electrical outputs via a communications link to a computer system that stores the electrical outputs in a computer-readable storage medium, such as non-volatile memory. Storing the electrical outputs in memory allows users to later retrieve information about the electrical output and to assess how the electrical output of the electrical devices are affected by varying thermal conditions experienced by the electrical devices. To facilitate this assessment, the electrical output may be stored along with information such as the time at which the electrical output was recorded and the thermal temperature experienced by the electrical device at the time the electrical output was recorded. Also, in order to conserve storage resources, the electrical output may be recorded and stored only periodically (e.g., once every ten minutes).

In one embodiment, the monitoring unit detects whether the electrical outputs being monitored contain any errors. Upon the detection of an error, the monitoring unit may shut down the electrical device. This may be achieved by the computer system communicating signals to the backplane which are then communicated to the electrical device to shut down the electrical device.

3.0 Testing System 3.1 Example Testing System Structural Details

FIG. 1 is an isometric view of a system 100 in accordance with an example embodiment. A fixture 102 is configured to receive one or more electrical devices for testing. Electrical devices 112A, 112B, and 112C (collectively, "112") have been received by fixture 102. Fixture 102 includes two rails, left rail 108 and right rail 110, that are vertically arranged with respect to electrical devices 112 that have been received by fixture 102. In FIG. 1, rails 108 and 110 are vertically oriented or arranged with respect to electrical devices 112.

Each of the rails 108, 110 comprises a plurality of inwardly protruding ribs 109, pairs of which define left and right slots 111 that may receive, contact and hold an electrical device 112. In this arrangement, edges of an electrical device 112 are held snugly in the rails 108, 110 and suspended in the fixture 102 relative to other electrical devices.

The system 100 further includes two thermal plates—left thermal plate 104 and right thermal plate 106. Left thermal plate 104 is placed in direct contact with left rail 108, and right thermal plate 106 is placed in direct contact with right rail 110. As such, the thermal plates 104 and 106 are also oriented perpendicularly with respect to electrical devices 112. In this arrangement, edges of electrical devices 112 directly contact slots 111, and rails 108, 110, so that heat or cold from thermal plates 104, 106 is conducted directly to the edges of the electrical devices. Further, the vertical orientation of plates 104, 106 enables conducting heat to or from a large surface area of the plates 104, 106 to edges of a large plurality of slots and devices. Therefore, in an embodiment multiple devices featuring edge conductivity issues can be concurrently tested.

The thermal plates 104 and 106 are controlled by controllers 114A and 114B (collectively, "114"). In FIG. 1, controller 114A controls the temperature of thermal plate 104, and controller 114B controls the temperature of thermal plate 106. In an embodiment, controllers 114 are commercially available from Sigma Systems, San Diego, Calif. The controllers 114 are in turn controlled by computer system 120. Computer system 120 communicates with controller 114A via communications link 115A and communicates with controller 114B via communications link 115B (collectively, "115"). Through communications links 115, computer system 120 instructs controllers 114 what temperature to set thermal plates 104 and 106.

Control program 122 resides on computer system 120 and is configured to determine the target temperatures for thermal plates 104 and 106. As just discussed, these target temperatures are communicated to controllers 114 via communications links 115. Control program 122 is also configured to set the target temperatures based on user input. FIG. 1 illustrates that computer system 120 is connected to a display unit 124 (illustrated here as a computer monitor) and a user input device 126 (illustrated here as a keyboard), through which a user may view and input desired temperatures. In other embodiments, other user input and output devices may be used such as a mouse, trackball, or printer.

As already discussed, control program 122 may use characterization data that indicates relationships between the temperatures of the thermal plates 104 and 106 and the temperatures experienced by the electrical devices under test (e.g., electrical devices 112) in its determination of target temperatures for the thermal plates 104 and 106.

System 100 also includes a monitoring unit that monitors the electrical output of the electrical devices 112 in the fixture 102. In system 100, the monitoring unit comprises backplane 116 and communications link 118. Backplane 116 is electrically coupled to the electrical devices 112 received by fixture 102 to receive the electrical outputs of the electrical devices 112. Backplane 116 may include one or more power supplies. Backplane 116 also communicates with computer system 120 via communications link 118. Thus, backplane 106 communicates the electrical outputs of electrical devices 112 to computer system 112. Control program 122, or another program that resides on computer system 120, can analyze the electrical outputs and store information about the electrical outputs on a computer-readable storage medium. In addition, control program 122 can detect if there is an error in the electrical outputs and take ameliorative measures in response to error detection. For example, when electrical devices 112 are DC-DC converters, backplane 116 can provide a particular input DC voltage having specified electrical characteristics and can receive a DC converted output voltage. Control program 122 can monitor and record the converted output over time and temperature changes and store data in a database, spreadsheet or file providing output voltage values, temperature values and time values. If the output is determined to be incorrect, improper or dangerous, log records can be written, input voltage can be adjusted, or devices can be shut down by signals through backplane 116.

In an embodiment, system 100 further comprises one or more power supplies for units under test, a control mechanism for the units under test, and a data acquisition system coupled to the units under test. For example, system 100 may comprise one or more power supplies that are coupled to electrical devices 112 to provide power to the devices during testing. In an embodiment, Xantrex power supplies may be used. The power supplies may be selectively energized under control of GPIB bus signals from computer system 120. To facilitate selective application of power to different electrical devices 112, computer system 120 may further comprise a digital I/O control card coupled to a plurality of solid state relays, such that an individual solid state relay is associated with a particular electrical device 112, or associated with a particular supply voltage for a particular electrical device 112. In an embodiment, a National Instruments digital I/O control card is used.

In an embodiment, backplane 106 further comprises or is coupled to a data acquisition system configured to receive output signals from electrical devices 112 and provide the signals to computer system 120 for analysis. In an embodiment, a data acquisition system from Agilent Technologies is used for this purpose. In general, the data acquisition system receives output signals from electrical devices 112, couples the signals to a multiplexer and DMM, and stores the resulting voltage readings for later analysis by computer system 120 or by a technician.

Figure 2:
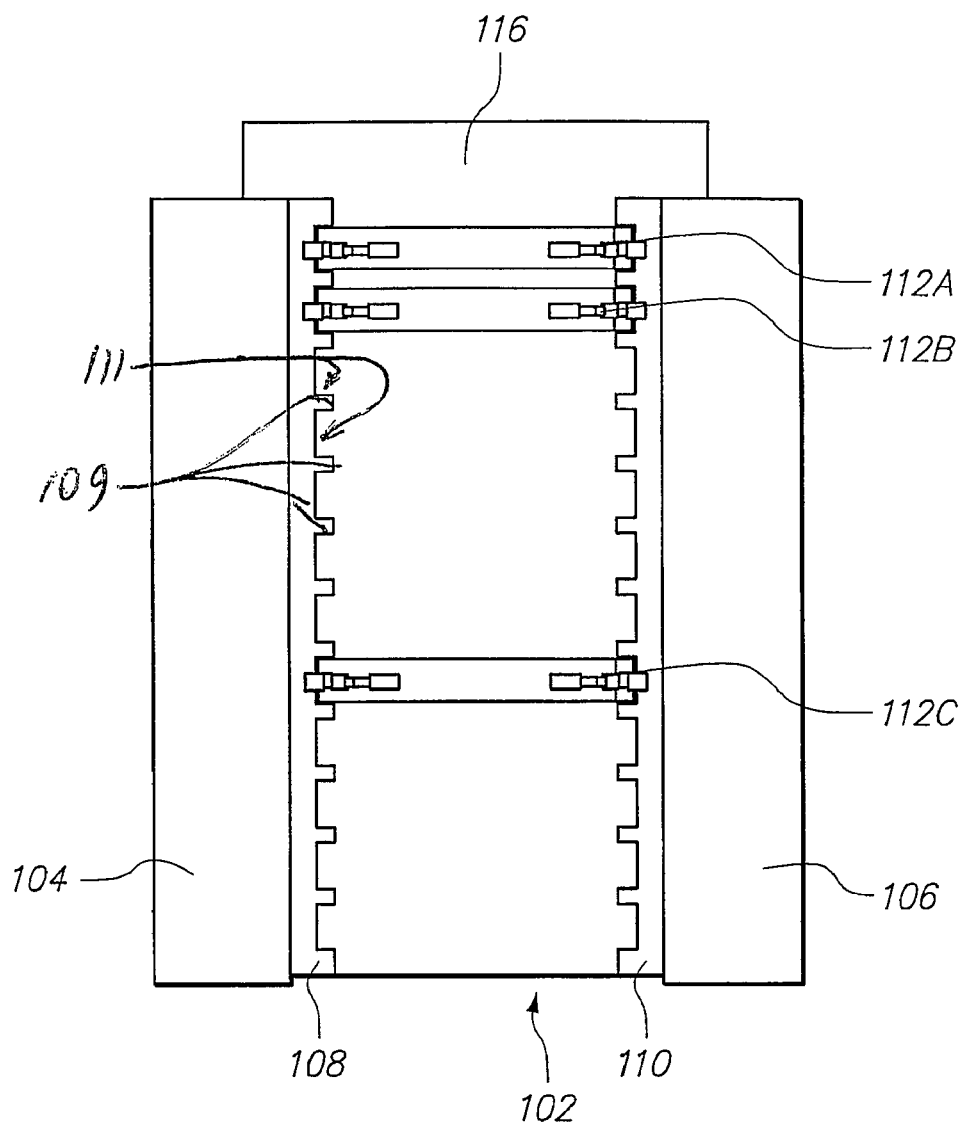
FIG. 2 is a frontal view of a fixture in a testing system in accordance with an embodiment.

FIG. 2 shows a frontal view of fixture 102. FIG. 2 illustrates that fixture 102 includes left rail 108 and right rail 110, which are in contact with left thermal plate 104 and right thermal plate 106, respectively. Indentations in the rails 108 and 110 from slots into which electrical devices may be inserted. FIG. 2 illustrates that electrical devices 112A, 112B, and 112C (collectively, 112) have been inserted into three such slots. Because the thermal plates 104 and 106 are in contact with rails 108 and 110, the temperatures of the thermal plates 104 and 106 directly affect the temperatures of rails 108 and 110. This in turn affects the temperatures of electrical devices 112, as electrical devices 112 are in contact with the rails 108 and 102. FIG. 2 also illustrates that backplane 116 is electrically coupled to electrical devices 112 at the back of fixture 102.

3.2 Testing System Functional Details

Figure 3:
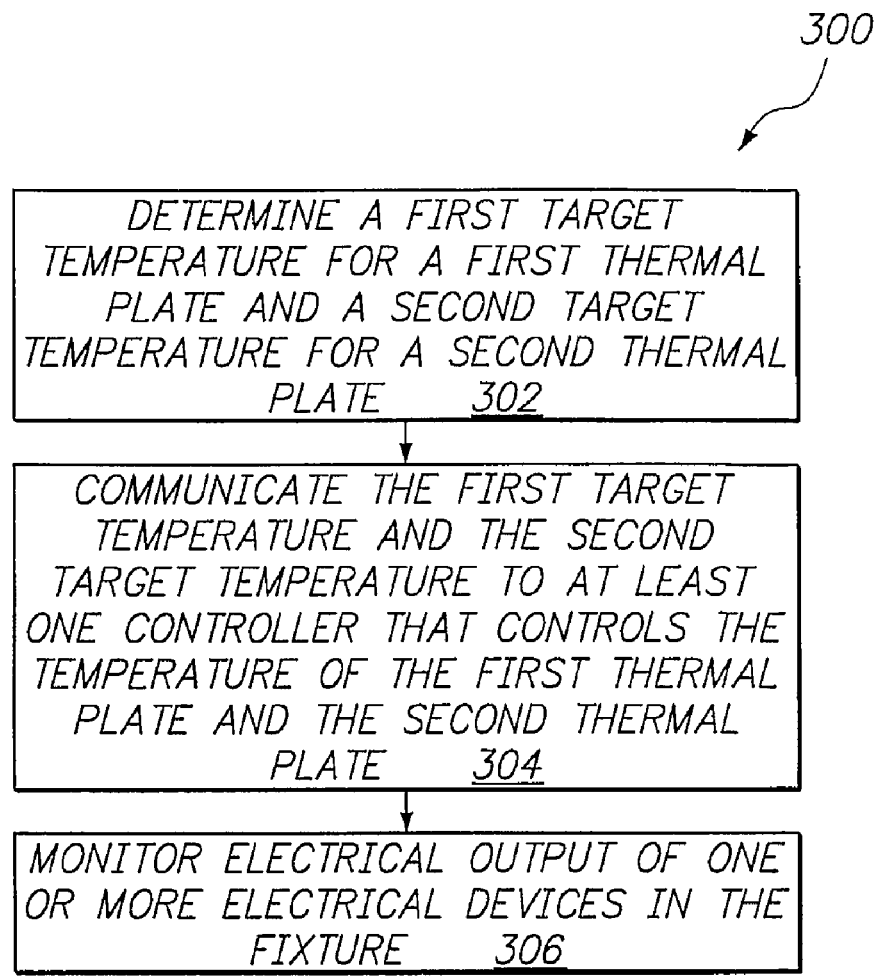
FIG. 3 is a flow chart that illustrates a process for testing an electrical device, in accordance with an embodiment.

Referring to FIG. 3, a process flow chart 300 for testing one or more electrical devices in accordance with an example embodiment is shown. In step 302, a determination is made as to target temperatures for a first thermal plate and a second thermal plate, such as thermal plate 106 and 108 in system 100. This determination may be made by a control program on a computer system, such as control program 122 on computer system 120 in system 100. A control program may also make this determination based on user input and on characterization data that indicates how temperatures of the thermal plates in a system like system 100 affect the temperatures of the rails in system 100.

In step 304, the determined target temperatures are communicated to controller or controllers that controls the temperatures of the first thermal plate and the second thermal plate. For example, the first and second thermal plates may be thermal plate 106 and thermal plate 108 and the controller or controllers may be controllers 114A and 114B in system 100. The controller or controllers are configured to set the temperatures of the thermal plates to the target temperatures.

In step 306, the electrical output of the one or more electrical devices under test is monitored. For example, the one or more electrical devices under test may be electrical devices 112A, 112B, and 112C in system 100. The monitoring may be performed through use of a backplane such as backplane 116 that is electrically coupled to the electrical outputs of devices 112A, 112B, and 112C and that communicates the electrical output back to control program 122 on computer system 120.

4.0 Extensions and Alternatives

In the foregoing specification, various inventive embodiments have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage, sequence, order, or attribute that is not expressly recited in a claim should limit the scope of such claim in any way. The specification and drawings are, accordingly, to be regarded in an example rather than a restrictive sense.

5.0 Hardware Overview

Figure 4:
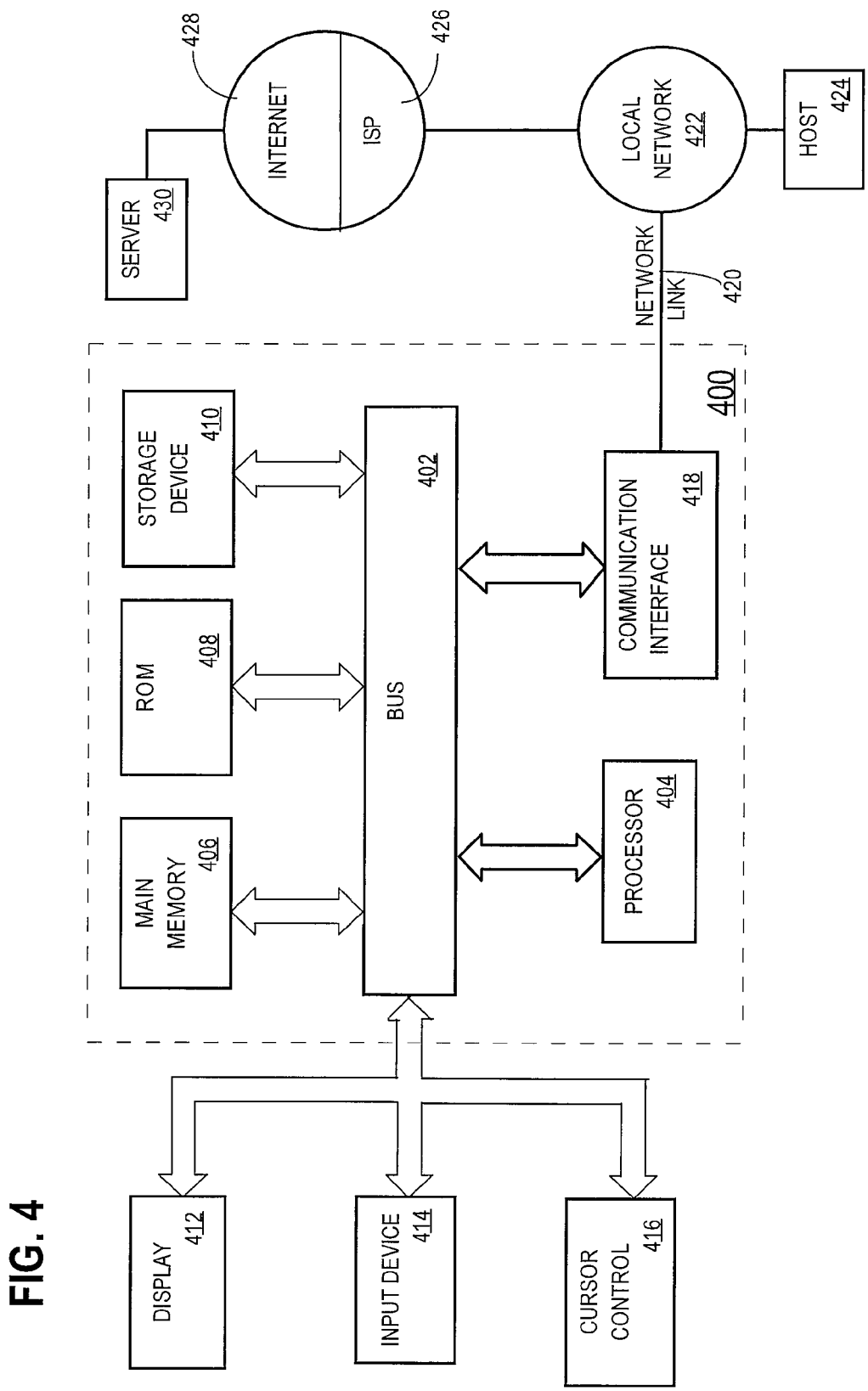
FIG. 4 is a block diagram of a computer system on which embodiments of the invention may be implemented.

FIG. 4 is a block diagram that illustrates a computer system 400 upon which an embodiment of the invention may be implemented. Computer system 400 includes a bus 402 or other communication mechanism for communicating information, and a processor 404 coupled with bus 402 for processing information. Computer system 400 also includes a main memory 406, such as a random access memory (RAM) or other dynamic storage device, coupled to bus 402 for storing information and instructions to be executed by processor 404. Main memory 406 also may be used for storing temporary variables or other intermediate information during execution of instructions to be executed by processor 404. Computer system 400 further includes a read only memory (ROM) 408 or other static storage device coupled to bus 402 for storing static information and instructions for processor 404. A storage device 410, such as a magnetic disk or optical disk, is provided and coupled to bus 402 for storing information and instructions.

Computer system 400 may be coupled via bus 402 to a display 412, such as a cathode ray tube (CRT), for displaying information to a computer user. An input device 414, including alphanumeric and other keys, is coupled to bus 402 for communicating information and command selections to processor 404. Another type of user input device is cursor control 416, such as a mouse, a trackball, or cursor direction keys for communicating direction information and command selections to processor 404 and for controlling cursor movement on display 412. This input device typically has two degrees of freedom in two axes, a first axis (e.g., x) and a second axis (e.g., y), that allows the device to specify positions in a plane.

The invention is related to the use of computer system 400 for implementing the techniques described herein. According to one embodiment of the invention, those techniques are performed by computer system 400 in response to processor 404 executing one or more sequences of one or more instructions contained in main memory 406. Such instructions may be read into main memory 406 from another machine-readable medium, such as storage device 410. Execution of the sequences of instructions contained in main memory 406 causes processor 404 to perform the process steps described herein. In alternative embodiments, hard-wired circuitry may be used in place of or in combination with software instructions to implement the invention. Thus, embodiments of the invention are not limited to any specific combination of hardware circuitry and software.

The term "machine-readable medium" as used herein refers to any medium that participates in providing data that causes a machine to operation in a specific fashion. In an embodiment implemented using computer system 400, various machine-readable media are involved, for example, in providing instructions to processor 404 for execution. Such a medium may take many forms, including but not limited to storage media. Storage media includes both non-volatile media and volatile media. Non-volatile media includes, for example, optical or magnetic disks, such as storage device 410. Volatile media includes dynamic memory, such as main memory 406. All such media must be tangible to enable the instructions carried by the media to be detected by a physical mechanism that reads the instructions into a machine.

Common forms of machine-readable media include, for example, a floppy disk, a flexible disk, hard disk, magnetic tape, or any other magnetic medium, a CD-ROM, any other optical medium, any other physical medium with patterns of holes, a RAM, a PROM, and EPROM, a FLASH-EPROM, any other memory chip or cartridge, or any other medium from which a computer can read.

Various forms of machine-readable media may be involved in carrying one or more sequences of one or more instructions to processor 404 for execution. For example, the instructions may initially be carried on a magnetic disk of a remote computer. The remote computer can load the instructions into its dynamic memory and send the instructions over a telephone line using a modem. A modem local to computer system 400 can receive the data on the telephone line and use an infra-red transmitter to convert the data to an infra-red signal. An infra-red detector can receive the data carried in the infra-red signal and appropriate circuitry can place the data on bus 402. Bus 402 carries the data to main memory 406, from which processor 404 retrieves and executes the instructions. The instructions received by main memory 406 may optionally be stored on storage device 410 either before or after execution by processor 404.

Computer system 400 also includes a communication interface 418 coupled to bus 402. Communication interface 418 provides a two-way data communication coupling to a network link 420 that is connected to a local network 422. For example, communication interface 418 may be an integrated services digital network (ISDN) card or a modem to provide a data communication connection to a corresponding type of telephone line. As another example, communication interface 418 may be a local area network (LAN) card to provide a data communication connection to a compatible LAN. Wireless links may also be implemented. In any such implementation, communication interface 418 sends and receives electrical, electromagnetic or optical signals that carry digital data streams representing various types of information.

Network link 420 typically provides data communication through one or more networks to other data devices. For example, network link 420 may provide a connection through local network 422 to a host computer 424 or to data equipment operated by an Internet Service Provider (ISP) 426. ISP 426 in turn provides data communication services through the world wide packet data communication network now commonly referred to as the "Internet" 428. Local network 422 and Internet 428 both use electrical, electromagnetic or optical signals that carry digital data streams. The signals through the various networks and the signals on network link 420 and through communication interface 418, which carry the digital data to and from computer system 400, are exemplary forms of carrier waves transporting the information.

Computer system 400 can send messages and receive data, including program code, through the network(s), network link 420 and communication interface 418. In the Internet example, a server 430 might transmit a requested code for an application program through Internet 428, ISP 426, local network 422 and communication interface 418.

The received code may be executed by processor 404 as it is received, and/or stored in storage device 410, or other non-volatile storage for later execution. In this manner, computer system 400 may obtain application code.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A system for testing electrical devices, the system comprising:
    a fixture configured to receive one or more electrical devices;
    a first thermal plate and a second thermal plate that are vertically arranged with respect to one or more electrical devices received by the fixture; and positioned to contact, respectively, a first rail and a second rail;
    controller or controllers that controls a first temperature of the first thermal plate and a second temperature of the second thermal plate;
    a monitoring unit electrically coupled to the one or more electrical devices received by the fixture;
    wherein the one or more electrical devices received by the fixture are in contact with the first rail and the second rail of the fixture.

2. The system of claim 1, further comprising:
    a control program that determines a first target temperature for the first thermal plate and a second target temperature for the second thermal plate;
    wherein the first target temperature and the second target temperature are communicated to the controller or controllers; and the controller or controllers is further configured to, in response to receiving communications containing the first target temperature and the second target temperature, adjust the first temperature of the first thermal plate to conform to the first target temperature and the second temperature of the second thermal plate to conform to the second target temperature.

3. The system of claim 2, wherein the control program determines the first target temperature for the first thermal plate and the second target temperature for the second thermal plate based on user input.

4. The system of claim 3, wherein the control program determines the first target temperature for the first thermal plate and the second target temperature for the second thermal plate based on characterization data that indicates a relationship between the first temperature of the first thermal plate and a resultant temperature of the first rail of the fixture and a relationship between the second temperature of the second thermal plate and a resultant temperature of the second rail of the fixture.

5. The system of claim 4, wherein the relationship between the first temperature of the first thermal plate and the resultant temperature of the first rail of the fixture and the relationship between the second temperature of the second thermal plate and the resultant temperature of the second rail of the fixture depend on which positions, within the fixture, are occupied by the one or more electrical devices.

6. The system of claim 4, wherein the characterization data is based on empirical measurements.

7. The system of claim 1, wherein the monitoring unit is configured to monitor one or more electrical outputs of the one or more electrical devices received by the fixture.

8. The system of claim 7, wherein the monitoring unit is configured to store data associated with the one or more electrical outputs to a computer-readable storage medium.

9. The system of claim 7, wherein the monitoring unit is configured to detect errors in the one or more electrical outputs.

10. A method comprising:
    determining a first target temperature for a first thermal plate and a second target temperature for a second thermal plate; wherein the first thermal plate and the second thermal plate are vertically arranged with respect to one or more electrical devices received by a fixture and positioned to contact respectively, a first rail and a second rail of the fixture;
    communicating the first target temperature and the second target temperature to controller or controllers that controls a first temperature of the first thermal plate and a second temperature of the second thermal plate; and
    monitoring one or more electrical outputs of the one or more electrical devices;
    wherein the one or more electrical devices received by the fixture are in contact with the first rail and the second rail of the fixture.

11. The method of claim 10, wherein the controller or controllers is configured to, in response to receiving communications containing the first target temperature and the second target temperature, adjust the first temperature of the first thermal plate to conform to the first target temperature and the second temperature of the second thermal plate to conform to the second target temperature.

12. The method of claim 11, wherein the step of determining the first target temperature for the first thermal plate and the second target temperature for the second thermal plate is performed based on user input.

13. The method of claim 12, wherein the step of determining the first target temperature for the first thermal plate and the second target temperature for the second thermal plate is performed based on characterization data that indicates a relationship between the first temperature of the first thermal plate and a resultant temperature of the first rail of the fixture and a relationship between the second temperature of the second thermal plate and a resultant temperature of the second rail of the fixture.

14. The method of claim 13, wherein the relationship between the first temperature of the first thermal plate and the resultant temperature of the first rail of the fixture and the relationship between the second temperature of the second thermal plate and the resultant temperature of the second rail of the fixture are dependent on which positions, within the fixture, are occupied by the one or more electrical devices.

15. The method of claim 13, wherein the characterization data is based on empirical measurements.

16. The method of claim 10, further comprising storing data associated with the one or more electrical outputs to a computer-readable storage medium.

17. The method of claim 10, further comprising detecting errors in the one or more electrical outputs.

18. An apparatus comprising:
    a fixture configured to receive one or more electrical devices;
    a first thermal plate and a second thermal plate that are vertically arranged with respect to the one or more electrical devices received by the fixture; and positioned to contact, respectively, a first rail and a second rail;
    a controller configured to control a first temperature of the first thermal plate and a second temperature of the second thermal plate;
    a monitoring unit electrically coupled to the one or more electrical devices received by the fixture;
    wherein the one or more electrical devices received by the fixture are in contact with the first rail and the second rail of the fixture.

19. The apparatus of claim 18, further comprising a computer-readable data storage medium storing a control program that is configured to determine a first target temperature for the first thermal plate and a second target temperature for the second thermal plate, to communicate the first target temperature and the second target temperature to the controller, and to adjust, in response to receiving communications containing the first target temperature and the second target temperature, the first temperature of the first thermal plate to conform to the first target temperature and the second temperature of the second thermal plate to conform to the second target temperature.

20. The apparatus of claim 19, wherein the control program is further configured to determine the first target temperature for the first thermal plate and the second target temperature for the second thermal plate based on user input.

* * * * *